US012672477B2

(12) United States Patent (10) Patent No.: US 12,672,477 B2
Ding et al. (45) Date of Patent: Jun. 30, 2026

(54) UNIVERSAL TREATMENT SOLUTION, TREATMENT METHOD AND USE OF PEROVSKITE LAYER

(71) Applicants: NINGBO INSTITUTE OF MATERIALS TECHNOLOGY AND ENGINEERING, CHINESE ACADEMY OF SCIENCES, Ningbo (CN); QIANWAN Institute of CNITECH, Ningbo (CN)

(72) Inventors: Shuo Ding, Ningbo (CN); Chaoyu Xiang, Ningbo (CN)

(73) Assignees: NINGBO INSTITUTE OF MATERIALS TECHNOLOGY AND ENGINEERING, CHINESE ACADEMY OF SCIENCES, Ningbo (CN); QIANWAN Institute of CNITECH, Ningbo (CN)

( * ) Notice: Subject to any disclaimer, the term of this patent is extended or adjusted under 35 U.S.C. 154(b) by 0 days.

(21) Appl. No.: 19/130,139

(22) PCT Filed: Nov. 14, 2023

(86) PCT No.: PCT/CN2023/131471
§ 371 (c)(1),
(2) Date: May 15, 2025

(87) PCT Pub. No.: WO2024/104329
PCT Pub. Date: May 23, 2024

(65) Prior Publication Data
US 2026/0013387 A1 Jan. 8, 2026

(30) Foreign Application Priority Data

Nov. 15, 2022 (CN) .......................... 202211431134.X

(51) Int. Cl.
*H10K 30/40* (2023.01)
*H10K 71/00* (2023.01)

(52) U.S. Cl.
CPC ........... *H10K 71/311* (2023.02); *H10K 30/40* (2023.02)

(58) Field of Classification Search
CPC ....... H10K 30/50–57; H10K 39/10–18; H10K 85/50
(Continued)

(56) References Cited

U.S. PATENT DOCUMENTS

2022/0328764 A1* 10/2022 Taylor .................... H10K 85/60
2023/0380266 A1* 11/2023 Zhu ........................ H10K 85/50

FOREIGN PATENT DOCUMENTS

CN 106634961 A 5/2017
CN 106750427 A 5/2017
(Continued)

OTHER PUBLICATIONS

CN-111628091-A English (Year: 2020).*
CN-112542547-A English (Year: 2021).*
Zema Chu, et al., Perovskite Light-Emitting Diodes with External Quantum Efficiency Exceeding 22% via Small-Molecule Passivation, Advanced Materials, 2021, pp. 1-9, vol. 33.
(Continued)

*Primary Examiner* — Bach T Dinh
(74) *Attorney, Agent, or Firm* — Bayramoglu Law Offices LLC

(57) ABSTRACT

A universal treatment solution, a treatment method and use of a perovskite layer are provided. The universal treatment solution includes a polar solvent and a non-polar solvent; the polar solvent includes amino and/or sulfonate. The treatment method includes: providing a perovskite layer; allowing the perovskite layer to be in contact with the universal treatment solution for a modified treatment; and removing the universal treatment solution. The universal treatment solution and treatment method can significantly improve the performance of a perovskite material. Since the principle of action does
(Continued)

Mixed solution

Annealing not change as the type and composition of the perovskite material change, the universal treatment solution and treatment method have a significant effect on the current perovskite material of almost all components. Meanwhile, the universal treatment solution has extremely strong reactivity, thus, the treatment method is extremely short in treatment time and has low requirements on treatment temperature and treatment devices.

15 Claims, 4 Drawing Sheets

(58) Field of Classification Search
USPC .................................................. 136/243–265
See application file for complete search history.

(56) References Cited

FOREIGN PATENT DOCUMENTS

| | | | | | |
|---|---|---|---|---|---|
| CN | 110867532 | A | | 3/2020 | |
| CN | 111628091 | A | * | 9/2020 | ............. C03C 17/34 |
| CN | 112467038 | A | | 3/2021 | |
| CN | 112542547 | A | * | 3/2021 | ............. H10K 71/12 |
| KR | 101819954 | B1 | | 2/2018 | |

OTHER PUBLICATIONS

Zhenyu Guo, et al., Promoting Energy Transfer via Manipulation of Crystallization Kinetics of Quasi-2D Perovskites for Efficient Green Light-Emitting Diodes, Advanced Materials, 2021, pp. 1-10, vol. 33.

* cited by examiner

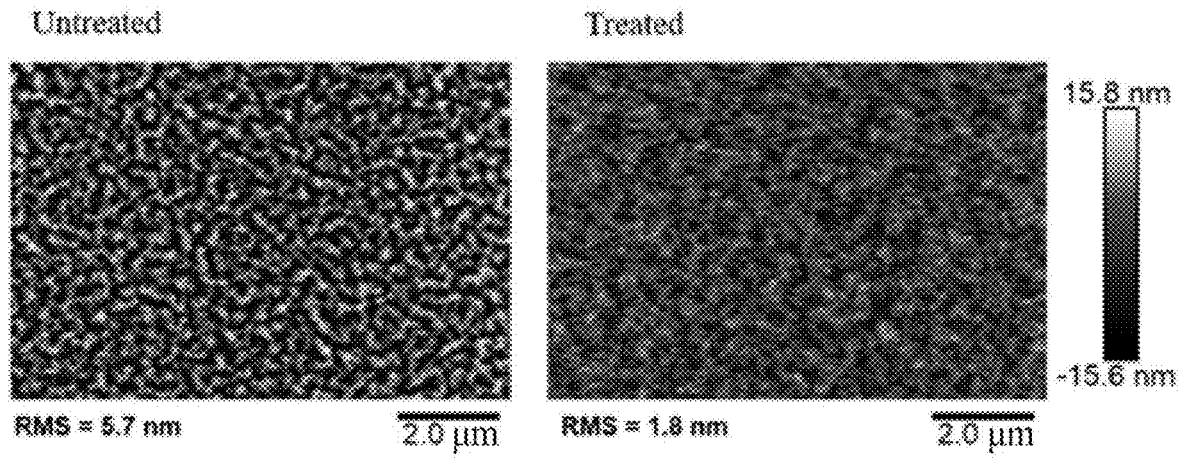
FIG. 4A                                    FIG. 4B
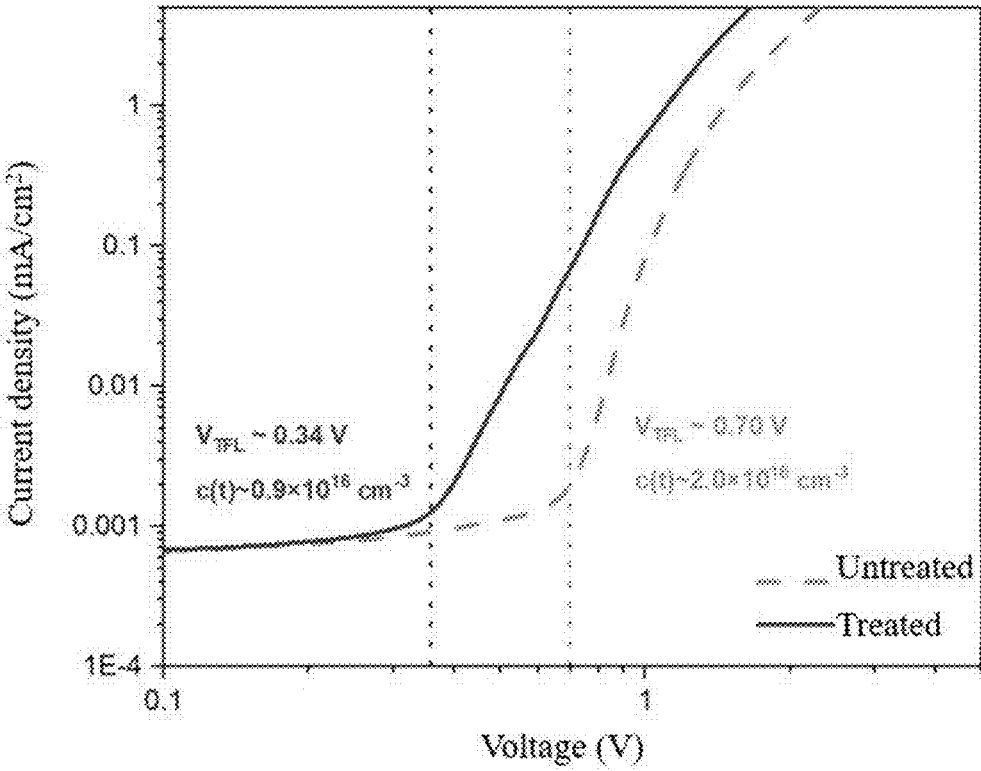
FIG. 5

UNIVERSAL TREATMENT SOLUTION, TREATMENT METHOD AND USE OF PEROVSKITE LAYER

CROSS REFERENCE TO THE RELATED APPLICATIONS

This application is the national phase entry of International Application No. PCT/CN2023/131471, filed on Nov. 14, 2023, which is based upon and claims priority to Chinese Patent Application No. 202211431134.X, filed on Nov. 15, 2022, the entire contents of which are incorporated herein by reference.

TECHNICAL FIELD

The present disclosure relates to the technical field of photoelectric materials, and particularly to a universal treatment solution, a treatment method and use of a perovskite layer.

BACKGROUND

Due to its excellent potential photoelectric characteristic, a perovskite material is widely applied in various photoelectric devices, including solar cells (photovoltaic, PV), light-emitting diodes (LED), photodetectors and other fields. However, the stability of the existing perovskite material, especially its stability to adverse environmental factors such as a humidity, a temperature and an illumination, is still far from meeting the requirements of commercial applications.

Meanwhile, the efficiencies for various perovskite devices still have rooms for improvement. Therefore, comprehensively improving the performance of the perovskite material is very necessary. Currently, the improvement of the stability of a perovskite photoelectric device is mainly achieved by depending on physical encapsulation with a lower water oxygen permeability and adding additives in a perovskite precursor (e.g., the existing literature 1: Chu, Z. et al. Adv. Mater. 33, e2007169, (2021). Guo, Z. et al. Adv. Mater. 33, e2102246, (2021)), whereas the improvement of the efficiency of the perovskite device also highly relies on the addition of additives.

However, in the currently used traditional method for improving the performance of perovskite, an expansive and complex high-vacuum apparatus is required to improve the physical encapsulation effect, which will lead to a complex device structure and a great increase of the manufacturing cost, and at the same time not solve the stability problem of the perovskite fundamentally. The device will degrade quickly once the encapsulation fails.

However, the scheme of adding the additives in the precursor is considerably specific. The specific additives are often only effective for a specific material system and are difficultly generalized to perovskite systems with other components, and also improve the difficulty and cost of research and development. Therefore, it is particularly important to research and develop a universal and simple treatment method capable of effectively improving the performance of the perovskite of various components.

To fundamentally improve the performance of the perovskite, a treatment method capable of optimizing the structure of the perovskite microscopically is needed, and this treatment method has universality and can be effectively applied to the perovskite systems of different components.

In the prior art, some universal treatment solutions for different perovskite systems are provided, for example the existing patent document 2: CN111628091A—method for improving quality of perovskite thin film through solvent bath assisted heat treatment. Requiring relatively long treatment time, relatively high treatment temperatures, specific reaction equipment and the like, these existing technologies, on the one hand, reduce the treatment efficiency, and on the other hand increase the treatment cost, which is not conducive to the industrialization and application of the perovskite photoelectric devices.

SUMMARY

In view of the defects in the prior art, the objective of the present disclosure is to provide a universal treatment solution, a treatment method and use of a perovskite layer.

To achieve the foregoing objective, the technical solution used in the present disclosure is as follows:

In a first aspect, the present disclosure provides a universal treatment solution of a perovskite layer, including a polar solvent and a non-polar solvent, the polar solvent including amino and/or sulfonate.

Further, a volume fraction of the polar solvent in the universal treatment solution is 0.01-5%.

Further, the volume fraction of the polar solvent in the universal treatment solution is 1-2%.

Further, the polar solvent includes any one of or a combination of more than two of n-pentylamine, n-hexamine, n-heptylamine, n-octamine, pentanesulfonic acid, hexanesulfonic acid and heptanesulfonic acid.

Further, when the polar solvent only contains amine, the volume fraction of the polar solvent is 0.01-2%.

Further, when the polar solvent only contains sulfonate, the volume fraction of the polar solvent is 0.5-1%.

Further, the non-polar solvent includes any one of or a combination of more than two of aromatics, esters, alkanes and halogenated hydrocarbons.

Further, the non-polar solvent includes any one of or a combination of more than two of benzene, benzene derivatives, ethyl acetate, methyl acetate, n-hexane, n-octane, chloroform and carbon tetrachloride.

In a second aspect, the present disclosure further provides a universal treatment method of a perovskite layer, including:

1) providing the perovskite layer;
2) allowing the perovskite layer to be in contact with the above-mentioned universal treatment solution for a modified treatment, time of the modified treatment being 2-10 s; and
3) removing the universal treatment solution in the perovskite layer that is subjected to the modified treatment.

Further, a temperature of the modified treatment is 0-50° C.

Further, the step 3) specifically includes:
performing a drying treatment on the perovskite layer that is subjected to the modified treatment;
Alternatively, performing an annealing treatment on the perovskite layer that is subjected to the modified treatment.

Further, a temperature of the annealing treatment is 60-150° C., and time of the annealing treatment is 10-600 s.

In a third aspect, the present disclosure further provides a perovskite layer obtained upon the treatment of the above-mentioned universal treatment method. Compared with the untreated perovskite layer, an average surface roughness, a film defect density and a nanosheet phase structure content of the treated perovskite layer are reduced.

Further, the average surface roughness of the perovskite layer is below 2.0 nm, and the film defect density is below $0.9 \times 10^{\wedge}16$ cm$^{-3}$.

Further, the perovskite layer does not contain the nanosheet phase structure.

In a fourth aspect, the present disclosure further provides a perovskite photoelectric device, including a first transport layer, a perovskite layer and a second transport layer, the perovskite layer being arranged between the first transport layer and the second transport layer, and the perovskite layer being subjected to a modified treatment through the above-mentioned universal treatment method.

In a fifth aspect, the present disclosure further provides a fabricating method of a perovskite photoelectric device, including:

a step of forming a first transport layer;

a step of forming a perovskite layer on a surface of the first transport layer;

a step of performing a modified treatment on the perovskite layer by using the above-mentioned universal treatment method; and a step of forming a second transport layer on a surface of the perovskite layer that is subjected to the modified treatment.

Based on the above-mentioned technical solution and compared with the prior art, the present disclosure at least includes the following beneficial effects:

1. Excellent universality: by utilizing the selective solubility of the perovskite material in polar and non-polar solvents, the universal treatment solution and treatment method provided by the present disclosure react with various defects or non-ideal phases formed in the preparation process of the perovskite, to remove defects and harmful non-ideal phases that cause the perovskite to degrade, thereby significantly improving the performance of the perovskite materials. Since its principle of action does not change as the type and composition of the perovskite material change, the universal treatment solution and treatment method have a significant effect on the current perovskite material of almost all components.

2. The crystal quality of the perovskite layer obtained upon treatment is significantly improved, specifically manifesting in significant improvements in aspects of surface roughness, defect density, and internal crystal phases, thereby enhancing the photoelectric conversion performance of the perovskite layer.

3. Since specific groups in the universal treatment solution provided in the present disclosure have extremely strong reactivity, the treatment time for the treatment method provided by the present disclosure is extremely short, thereby significantly improving the treatment efficiency.

4. The universal treatment method provided by the present disclosure has relatively low requirements on treatment temperature and treatment equipment, which is very conducive to promoting the applications in industry.

5. The material of the universal treatment method provided by the present disclosure is selected from common solvents, with a low cost.

The above description is only an overview of the technical solution of the present disclosure. In order to make those skilled in the art more clearly understand the technical means of the present disclosure and implement it in accordance with the content of the specification, the preferred embodiments of the present disclosure are described below in combination with detailed drawings.

BRIEF DESCRIPTION OF THE DRAWINGS

FIGS. 4A-4B are surface morphology test pictures before and after treatment with a universal treatment method provided in a typical embodiment of the present disclosure;

FIG. 5 is a defect density test graph before and after treatment with a universal treatment method provided in a typical embodiment of the present disclosure.

DETAILED DESCRIPTION OF THE EMBODIMENTS

Figure 1:
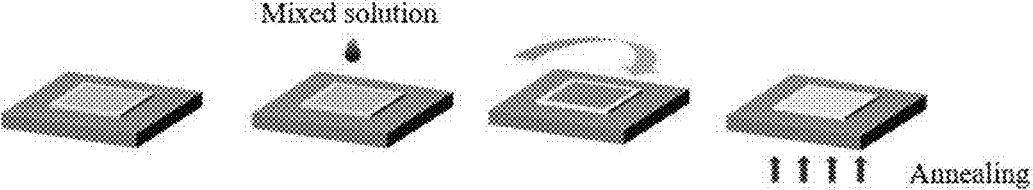
FIG. 1 is a flowchart of a universal treatment method of a perovskite layer provided in a typical embodiment of the present disclosure.

In the prior art, a universal treatment method of a perovskite layer is provided, however, requiring relatively long reaction time, a soaking reaction only, a relatively high reaction temperature and specific reaction equipment, this method is disadvantageous for large-scale industrial applications.

In view of the deficiency in the prior art, the inventor of this case proposes the technical solution of the present disclosure via long-term research and lots of practices. Next, the technical solution, implementation process and principle will be further explained and illustrated.

The following description sets forth many specific details so as to fully understand the present disclosure. However, the present disclosure can also be implemented using other methods different from the method described here, and therefore the scope of protection of the present disclosure is not limited by specific embodiments disclosed below.

Furthermore, relationship terms such as "first", "second" and the like are only used for distinguishing one part or method step from another part with the same name or method step, but do not necessarily require or imply there is any actual relationship or order among these parts or method steps.

The inventor has found that the reactivity of amine and sulfonate in the universal treatment solution is much higher than that of the polar solvent in the prior art. Therefore, based on the above findings, the embodiment of the present disclosure provides a universal treatment solution of a perovskite layer, including a polar solvent and a non-polar solvent, the polar solvent including amino and/or sulfonate.

In some embodiments, the polar solvent can include any one of or a combination of more than two of n-pentylamine, n-hexamine, n-heptylamine, n-octamine, pentanesulfonic acid, hexanesulfonic acid and heptanesulfonic acid, but is not limited thereto.

It is noted that the polar solvent used in the present disclosure is not limited to the exemplary range mentioned above, and other amines or organic sulfonic acids with similar molecular structures can also be used. Based on the actual research and development experience of the inventor of the present disclosure, the molecule of the polar solvent used has 1-2 amino groups, and the number of sulfonate groups usually can only be 1, which is because too many polar groups may cause the molecular polarity of the polar solvent to be too strong, leading to the dissolution or damage of the perovskite film.

Furthermore, amine substances and sulfonic acid substances are prone to an acid-base neutralization reaction after being mixed, therefore, the mixing of amine polar solvents and sulfonic acid polar solvents may generate a reaction so as not to exert technical effects; however, it is also possible to provide a molecule, which has both amino and sulfonate groups and does not undergo an intramolecular reaction due to steric hindrance, as the polar solvent. Therefore, the simultaneous inclusion of the amino and sulfonate groups in the treatment solution is not excluded within the implementable scope of the present disclosure.

In some embodiments, a volume fraction of the polar solvent in the universal treatment solution is 0.01-5%. In a more preferred embodiment, the volume fraction of the polar solvent is further preferably 0.5-2%. The implementation scope of the optimal volume fraction is concluded by the inventor through multiple experiments. When the numerical value is too high, the structural damage of the perovskite film will be caused, and even the complete dissolution; when the numerical value is too low, the treatment efficiency will be reduced, such that the film incompletely reacts, and the photoelectric performance cannot be sufficiently improved.

In some embodiments, when the polar solvent only contains sulfonate, the volume fraction of the polar solvent may be 0.01-2%. In a more preferred embodiment, the volume fraction of the polar solvent is further preferably 0.5-1%. Similarly, if the volume fraction is too high, the structural damage of the perovskite film will be caused, and even the complete dissolution; if the volume fraction is too low, the treatment efficiency will be reduced, such that the film incompletely reacts, and the photoelectric performance cannot be sufficiently improved. Whereas when the polar solvent only contains amino, the volume fraction can be 0.01-5%. In a more preferred embodiment, the volume fraction is further preferably 0.5-1%. Similarly, when the volume fraction is too high, the structural damage of the perovskite film will be caused, and even the complete dissolution; when the volume fraction is too low, the treatment efficiency will be reduced, such that the film incompletely reacts, and the photoelectric performance cannot be sufficiently improved.

In some embodiments, the non-polar solvent can for example include any one of or a combination of more than two of aromatics, esters, alkanes and halogenated hydrocarbons.

In a more specific embodiment, the non-polar solvent can for example include any one of or a combination of more than two of benzene, benzene derivatives, ethyl acetate, methyl acetate, n-hexane, n-octane, chloroform and carbon tetrachloride, and is not limited thereto. The main function of the non-polar solvent is that, on the one hand, the polar solvent is dissolved and the concentration of the non-polar solvent is adjusted, and on the other hand, a selective dissolution is formed to the perovskite by cooperating with the polar solvent, to improve the crystal quality of the perovskite. Therefore, selecting other specific non-polar solvents with similar molecular structures or solubility in a range different from the above examples can also achieve similar effects.

Referring to FIG. 1, the embodiment of the present disclosure further provides a universal treatment method of a perovskite layer, including the following steps:

1) providing the perovskite layer;
2) allowing the perovskite layer to be in contact with the universal treatment solution in any above embodiment on for a modified treatment, time of the modified treatment being 2-10 s; and;
3) removing the universal treatment solution in the perovskite layer that is subjected to the modified treatment.

As shown above, in the present disclosure, it is necessary to not only accurately control the content of the polar solvent selected, but also deliberately control the reaction time of contact with the perovskite layer and precisely control the time in seconds. This is because the addition of the polar solvent makes the treatment solution strongly dissolve the perovskite. If the treatment time is not properly controlled, too-short time leads the incapability of forming the treatment effect, slightly prolonged time makes the perovskite film destructively dissolved, thereby significantly reducing the performance of the perovskite layer in a cliff like manner, and in severe cases, even directly losing all the photoelectric conversion performances.

In some embodiments, a temperature the modified temperature is 0-50° C.

In some embodiment, the step 3) specifically includes the following steps:

performing a drying treatment on the perovskite layer that is subjected to the modified treatment;

Alternatively, performing an annealing treatment on the perovskite layer that is subjected to the modified treatment.

In some embodiment, a temperature of the annealing treatment is 60-150° C., and time of the annealing treatment is 10-600 s.

Figure 3:
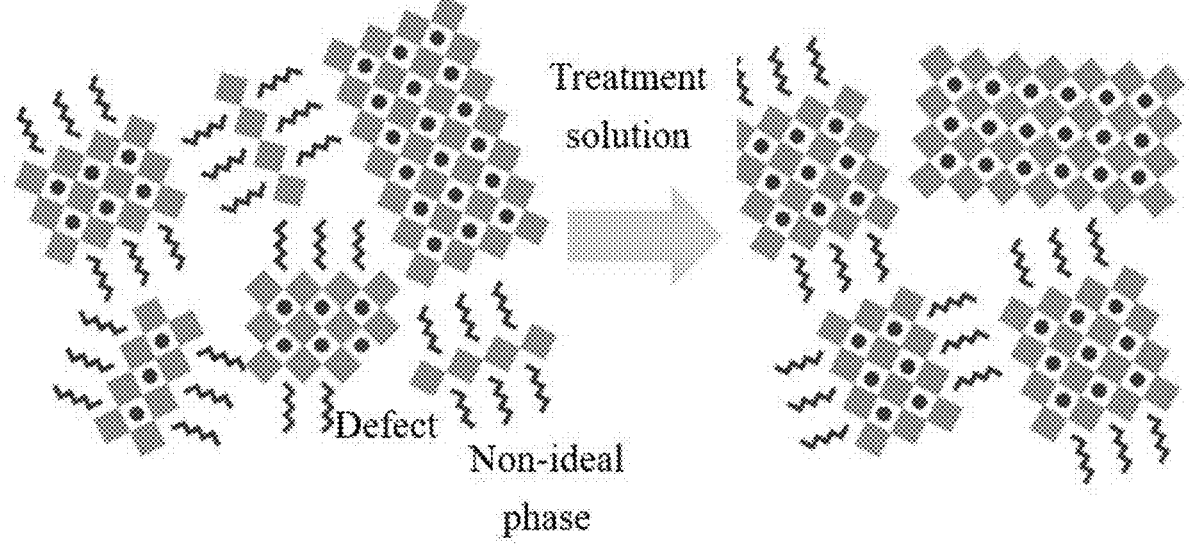
FIG. 3 is a principle diagram of universal treatment methods provided in a typical embodiment and a comparative example of the present disclosure.

FIG. 3 shows the principle of the above-mentioned treatment method. By utilizing the selective solubility of the perovskite material in polar and non-polar solvents, the universal treatment solution improving the performance of the perovskite reacts with various defects or non-ideal phases formed in the preparation process of the perovskite, to remove defects and harmful non-ideal phases that cause the perovskite to degrade, thereby significantly improving the performance of the perovskite materials. Since its principle of action does not change as the type and composition of the perovskite material change, the universal treatment solution has a significant effect on the current perovskite material of almost all components.

As some typical application examples of the above-mentioned technical solutions, the embodiment of the present disclosure provides a universal solution treatment method for improving the stability of perovskite; the main components of the treatment solution used include a polar solvent and a non-polar solvent. The polar solvent is mainly an organic small molecule or ion containing amino or sulfonate, and the non-polar solvent is mainly composed of benzene and derivatives thereof. A corresponding proportion of the polar solvent to the non-polar solvent in the treatment solution should be controlled in a specific range. to ensure the treatment effect.

When the universal treatment solution is used, the perovskite layer prepared in advance can be completely immersed into the treatment solution, then the perovskite layer is taken out after fully reacting for a few seconds, making the wet perovskite surface be dried. However, the annealing treatment can serve as an optional subsequent treatment method, which can accelerate the evaporation of the treatment solution and shorten the treatment time. The universal treatment solution can be used for the perovskite material with various components.

However, the treatment method of this treatment solution is not only limited to immersion, it is not necessary to completely immerse the perovskite layer in the reaction solution for a long time (10-120 min) like in the existing technology due to extremely short treatment time, as long as the treatment solution passes through the surface of the perovskite layer. In addition, heating (80-200° C.) and heat preservation like the existing technology are not needed. The reaction can be fully carried out at room temperature or even below room temperature, and therefore a specialized reaction container is not needed to provide. Therefore, simple treatment methods such as spraying and drip coating can achieve the same technical effect. The technical solution provided by the existing technology cannot achieve the high efficiency and convenience of the treatment method provided by the embodiments of the present disclosure, and thus the cost thereof is much higher than that of the present disclosure.

As a more specific example, as shown in FIG. 1, in a typical process of treating the perovskite material with the universal treatment solution, the perovskite layer prepared in advance is completely drip-coated and immersed into 300 μL of mixed treatment solution. After reacting completely, the perovskite layer is taken out, making the wet perovskite surface be dried. The annealing can serve as an optional subsequent treatment method, which can accelerate the evaporation of the treatment solution and shorten the treatment time. The annealing temperature can be selected in a range identical or similar to the annealing temperature of the perovskite, generally between 60° C. and 150° C.

Figure 2A:
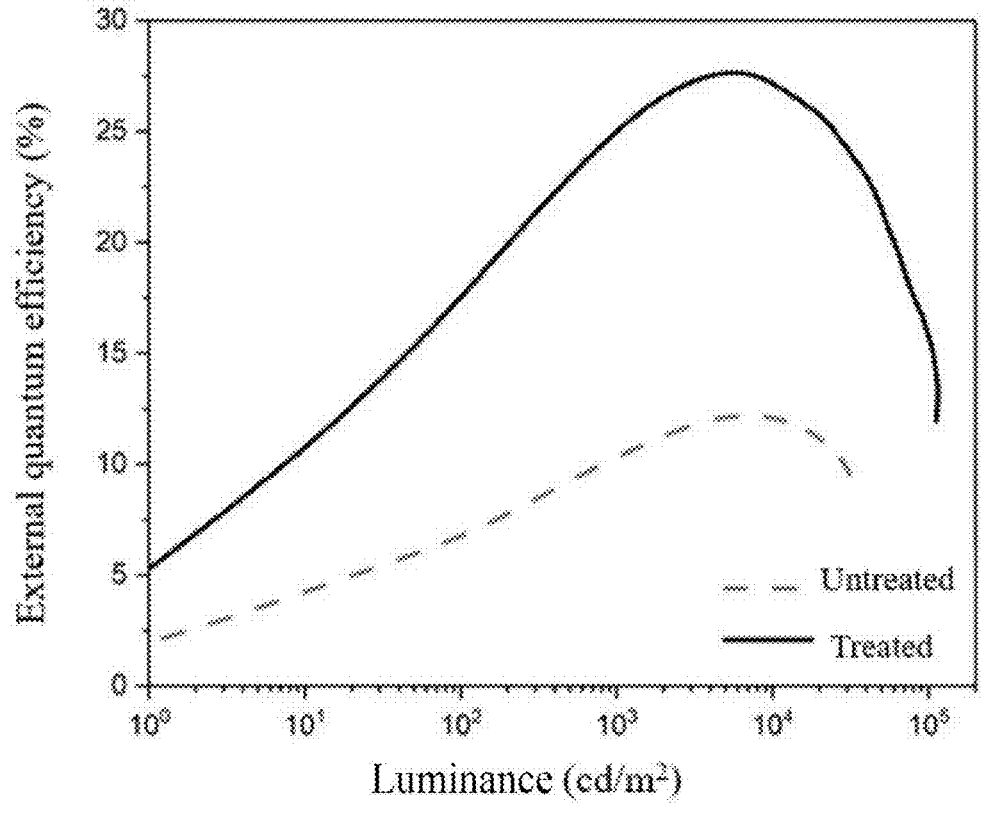
FIG. 2A is a current efficiency test graph of perovskite devices provided in a typical embodiment and a comparative example of the present disclosure.
Figure 2B:
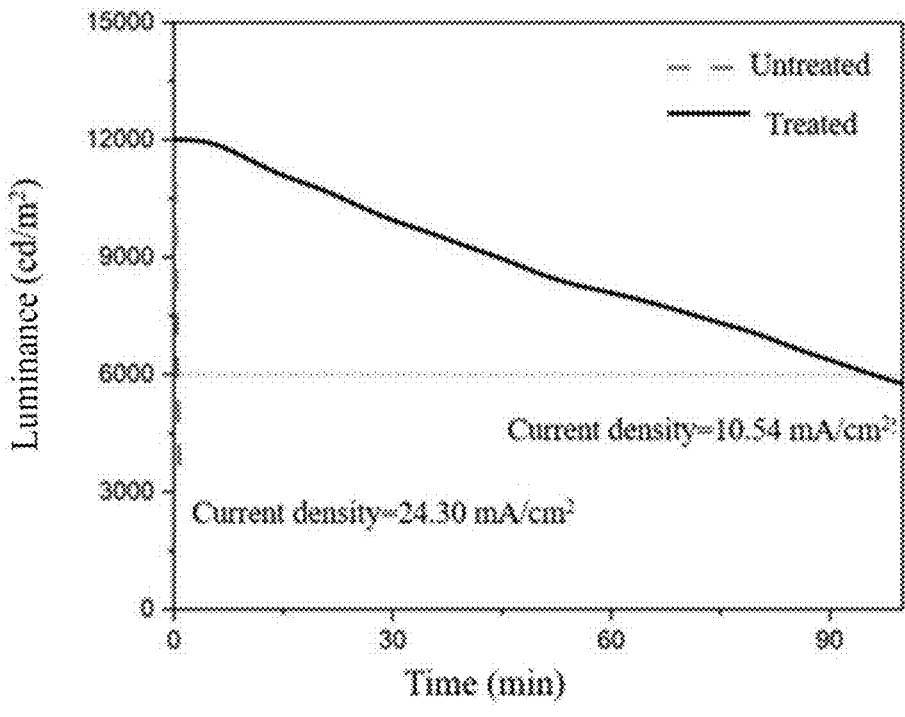
FIG. 2B is an operational lifetime test graph of perovskite devices provided in a typical embodiment and a comparative example of the present disclosure.

In a typical case, as shown in FIG. 2A and FIG. 2B, by treating the perovskite material with a 1% universal treatment solution, the current efficiency of the prepared perovskite light-emitting diode can be improved to more than twice that of the untreated device, and the operational lifetime increases by more than two orders of magnitude.

The embodiment of the present disclosure further provides a perovskite layer obtained upon the treatment of the universal treatment method provided in any of the above embodiments. Compared with the untreated perovskite layer, an average surface roughness, a film defect density and a nanosheet phase structure content of the treated perovskite layer are reduced.

In some specific embodiments, the average surface roughness of the perovskite layer is below 2.0 nm, and the film defect density is below $0.9 \times 10^{16}$ cm$^{-3}$.

In some embodiments, the perovskite layer does not contain the nanosheet phase structure. Specific film layer characteristics are as shown in the following examples.

The embodiment of the present disclosure further provides a perovskite photoelectric device, including a first transport layer, a perovskite layer and a second transport layer, the perovskite layer being arranged between the first transport layer and the second transport layer, and the perovskite layer being subjected to a modified treatment through the universal treatment method provided in any of the above embodiments.

The embodiment of the present disclosure further provides a fabricating method of a perovskite photoelectric device, including the following steps:

a step of forming a first transport layer;

a step of forming a perovskite layer on a surface of the first transport layer;

a step of performing a modified treatment on the perovskite layer by using the universal treatment method provided in any of the above embodiments; and a step of forming a second transport layer on a surface of the perovskite layer that is subjected to the modified treatment.

Next, the technical solution of the present disclosure will be illustrated in detail through several embodiments in combination with drawings. However, the selected embodiments are only for illustrating the present disclosure, but not limiting the scope of the present disclosure.

Example 1

This example provides a preparation process of a perovskite device, including a treatment process for a perovskite layer, which is specifically as follows:

A piece of glass with an indium tin oxide electrode prepared in advance was provided as a substrate, with an electrode thickness of 100 nm and a glass thickness of 0.7 cm.

Spin-coating and drying were performed on the substrate to form a hole transport layer with a thickness of 50 nm and made of a poly(3,4-ethylenedioxythiophene)-poly(styrene sulfonate) material.

Spin-coating and drying were performed to form a perovskite layer with a thickness of 50 nm and made of a formamidine lead bromide perovskite material or a methylamine lead bromide perovskite material.

Amino polar solvents n-hexane and benzene were mixed to prepare a universal treatment solution, a volume fraction of the amino polar solvent was 0.01%, then 300 μL of treatment solution was drip-coated onto the perovskite layer to be maintained for 5 s at room temperature (about 25° C.), and then the treatment solution was annealed for 60 s at 80° C., to form the treated perovskite layer.

Evaporation was performed on the perovskite layer to form an electron transport layer with a thickness of 40 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Example 2

This example provides a preparation process of a perovskite device, including a treatment process for a perovskite layer, which is substantially the same as that in example 1 only except that:

the volume fraction of an amino polar solvent in an universal treatment solution was 1%.

Example 3

This example provides a preparation process of a perovskite device, including a treatment process for a perovskite layer, which is substantially the same as that in example 1 only except that:

the volume fraction of an amino polar solvent in a universal treatment solution was 5%.

Comparative Example 1-1

This comparative example provides a preparation process of a perovskite device, including a treatment process for a perovskite layer, which is substantially the same as that in example 1 only except that:

an amino polar solvent was not added in a universal treatment solution.

Comparative Example 1-2

This comparative example provides a preparation process of a perovskite device, including a treatment process for a perovskite layer, which is substantially the same as that in example 1 only except that:

the volume fraction of an amino polar solvent in a universal treatment solution was 10%.

A light-emitting efficiency test and an operational lifetime test were performed on light-emitting diodes provided in examples 1-3 and comparative examples 1-1 and 1-2. The light-emitting efficiency test was that the maximum light-emitting efficiency of the light-emitting diode in a voltage range of 0-10 V is scanned under the environment conditions of room temperature (about 25° C.) and medium humidity (30-80%). The operational lifetime test was that a voltage was adjusted under the environment conditions of room temperature (about 25° C.) and medium humidity (30-80%) such that the luminance reached the initial luminance and the operational lifetime of the light-emitting diode under a corresponding constant current was guaranteed.

Table 1 below shows relationships between the maximum efficiencies of treated perovskite light-emitting diodes and concentrations of used treatment solutions in the above-mentioned examples and comparative examples.

TABLE 1

| Relationships between the maximum efficiency of treated perovskite light-emitting diode and the concentration of the treatment solution | |
| --- | --- |
| Amino molecule content (% vol) | The maximum efficiency of the light-emitting diode (%) |
| 0 | 12.1 |
| 0.01 | 16.1 |
| 1 | 27.8 |
| 5 | 13.3 |
| 10 | 0.7 |

It can be seen that in a volume concentration ranging from one ten thousandth to five percent, the maximum efficiency of the treated perovskite light-emitting diode is improved compared with that of the untreated perovskite light-emitting diode, and therefore during actual use, the relative proportions of the amino polar portion to the non-polar portion should be controlled in a specific range, to ensure the optimal treatment effect.

For the light-emitting efficiency and operational lifetime, the test results of the light-emitting diodes in example 2 and comparative example 1 are as shown in FIG. 2A and FIG. 2B, respectively. As can be seen, the perovskite material is treated with a 1% universal treatment solution in example 2, such that the current efficiency of the prepared perovskite light-emitting diode can be improved to more than twice that of the untreated device, and the operational lifetime increases by more than two orders of magnitude.

Example 4

This example provides a preparation process of a perovskite device, including a perovskite layer for a treatment process, which is substantially the same as that in example 1 only except that:

An amino polar solvent in a universal treatment solution was replaced with a sulfate polar solvent whose compound name was heptanesulfonic acid.

Example 5

This example provides a preparation process of a perovskite device, including a perovskite layer for a treatment process, which is substantially the same as that in example 4 only except that:

The volume fraction of a sulfate polar solvent in a universal treatment solution was 1%.

Example 6

This example provides a preparation process of a perovskite device, including a perovskite layer for a treatment process, which is substantially the same as that in example 4 only except that:

The volume fraction of a sulfate polar solvent in a universal treatment solution was 2%.

Comparative Example 2-1

This comparative example provides a preparation process of a perovskite device, including a perovskite layer for a treatment process, which is substantially the same as that in example 4 only except that:

A sulfate polar solvent was not added in a universal treatment solution.

Comparative Example 2-2

This comparative example provides a preparation process of a perovskite device, including a perovskite layer for a treatment process, which is substantially the same as that in example 4 only except that:

The volume fraction of a sulfate polar solvent in a universal treatment solution was 5%.

Comparative Example 2-3

This comparative example provides a preparation process of a perovskite device, including a perovskite layer for a treatment process, which is substantially the same as that in example 4 only except that:

The volume fraction of a sulfate polar solvent in a universal treatment solution was 10%.

A light-emitting efficiency test and an operational lifetime test were performed on light-emitting diodes provided in examples 4-6 and comparative examples 2-1, 2-2 and 2-3. Table 2 shows relationships between the maximum efficiencies of treated perovskite light-emitting diodes and concentrations of used treatment solutions in the above examples and comparative examples.

TABLE 2

| Relationships between maximum efficiencies of treated perovskite light-emitting diodes and concentrations of treatment solutions | |
| --- | --- |
| Sulfate molecule content (% vol) | The maximum efficiency of the light-emitting diode (%) |
| 0 | 12.1 |
| 0.01 | 14.1 |
| 1 | 23.9 |
| 2 | 15.8 |

TABLE 2-continued

| Relationships between maximum efficiencies of treated perovskite light-emitting diodes and concentrations of treatment solutions | |
| --- | --- |
| Sulfate molecule content (% vol) | The maximum efficiency of the light-emitting diode (%) |
| 5 | 2.3 |
| 10 | 0.1 |

It can be seen that in a volume concentration ranging from one ten thousandth to two percent, the maximum efficiency of the treated perovskite light-emitting diode is improved compared with that of the untreated perovskite light-emitting diode, and therefore during actual use, the relative proportions of the sulfate polar portion to the non-polar portion should be controlled in a specific range, to ensure an optimal treatment effect.

Comparative Example 3

Suggestions are provided:
The universal mixed treatment solution in the prior art was used: a mixed solvent of chlorobenzene and dimethylformamide, wherein the volume content of dimethylformamide was 1%, the treatment time and treatment temperature that were the same as those in example 1 were used, the same drip-coating method was used (300 μL). Since the reactivity was obviously lower than that in the present disclosure, the maximum efficiency was only 13.4% that was far lower than 27.8% in example 2; meanwhile, the operational lifetime was 1/20 of that in example 2.

Example 7

This comparative example provides a preparation process of a perovskite device, including a treatment process for a perovskite layer, which is substantially the same as that in example 1 only except that:
The material of the perovskite layer was replaced with methylamine lead bromide perovskite.
Through treatment, the light-emitting efficiency and operational lifetime of the perovskite device provided in this example were still improved, which was similar to example 1.

Example 8

This comparative example provides a preparation process of a perovskite device, including a treatment process for a perovskite layer, which is substantially the same as that in example 1 only except that:
The material of the perovskite layer was replaced with cesium lead iodine perovskite.
Through treatment, the light-emitting efficiency and operational lifetime of the perovskite device provided in this example were still improved, which was similar to example 1.
The top light-emitting efficiency obtained through the test in the above-mentioned examples served as the most representative example for test characterization. It can be found that, as shown in FIGS. 4A-4B, the treated perovskite layer has more uniform and smooth surface topography than the untreated perovskite layer: through measurement via an atomic force microscope, the surface roughness of the treated perovskite layer is obviously lower than that of the surface of the untreated perovskite layer. On the typical methylamine lead bromide perovskite sample, the surface of the untreated perovskite sample exhibits an uneven rough morphology. After being treated with the universal treatment solution, the surface exhibits a smooth surface morphology, as shown in the following figure, the root mean square (RMS) of the surface average roughness of the untreated perovskite sample is 5.7 nm, while the RMS of the surface average roughness of the treated perovskite sample is reduced to 1.8 nm. The uniform and smooth perovskite surface not only exhibits the high film quality of the treated sample, but also facilitates the improvement of effective contact between the perovskite layer and other layers in the device.

Meanwhile, as shown in FIG. 5, the treated perovskite film layer has lower defect density: after treatment with the universal treatment solution, the defect density inside the film is greatly reduced. Specifically speaking, the defect densities inside the untreated and treated perovskite films are measured through a space charge limited current method. The defect density of the untreated perovskite film in a typical methylamine lead bromide perovskite sample reaches $2.0 \times 10^{\wedge}16$ cm$^{-3}$, and the defect density inside the perovskite film treated with the universal treatment solution is reduced to $0.9 \times 10^{\wedge}16$ cm$^{-3}$. Such the perovskite film with the low defect density not only facilitates the preparation of high-efficiency electroluminescence and high-efficiency perovskite light-emitting diodes, but also significantly improves the stability of the film.

Figure 6:
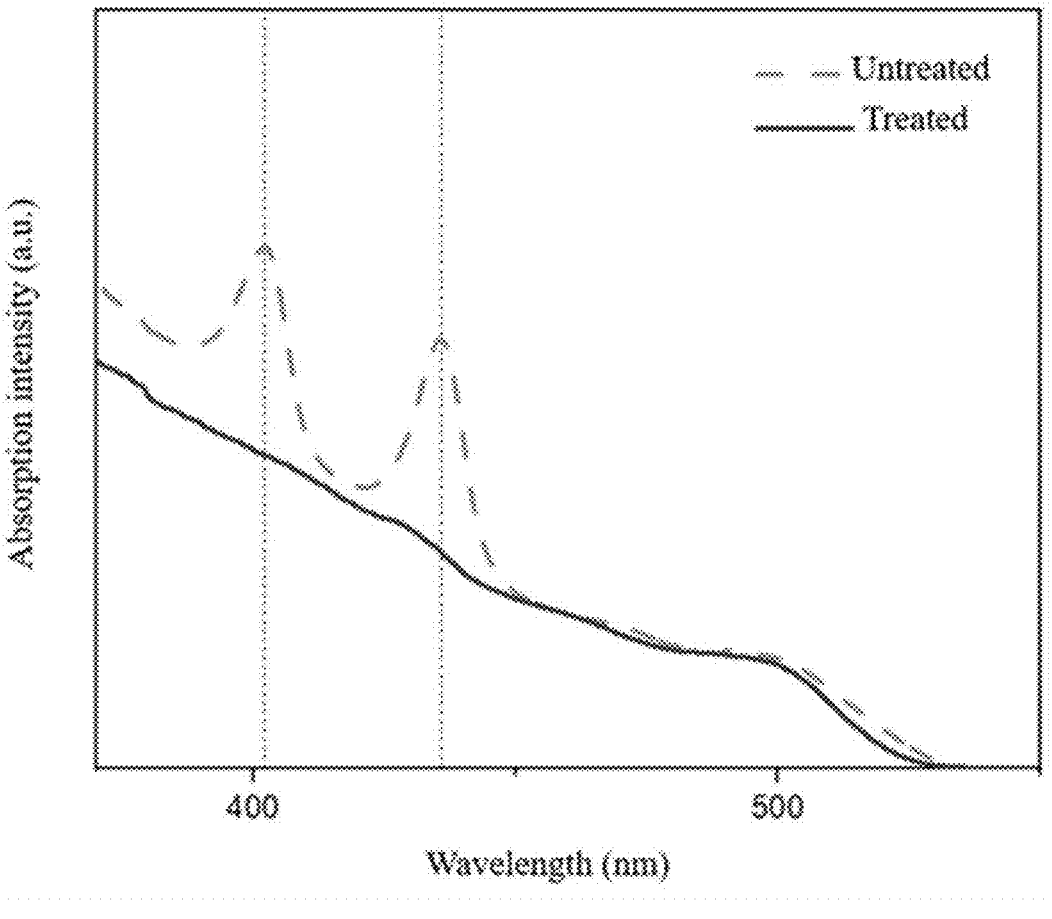
FIG. 6 is an absorption spectrum test graph before and after treatment with a universal treatment method provided in a typical embodiment of the present disclosure.

And, the thin nanosheet structure in the treated perovskite film layer is significantly reduced, such that the typical example does not contain small-size phase structures such as thin nanosheets ("does not contain" means that characterization measurement cannot be performed through a corresponding technical means). The small-size grain phase structure such as thin nanosheets in the perovskite film is one of leading causes for inducing material instability, characterized by short-wavelength absorption peaks. In a typical methylamine lead bromide perovskite sample, the untreated perovskite film exhibits obvious short-wavelength absorption peaks, as shown in FIG. 6, absorption peaks near 400 nm and 435 nm. However, the sample treated with the universal treatment solution exhibits a smooth-linked absorption intensity variation curve, indicating that small-size grain phase structures such as thin nanosheets are not contained inside.

Example 9

This example provides a preparation process of a perovskite device, including a treatment process for a perovskite layer, which is specifically as follows:
A piece of glass with an indium tin oxide electrode prepared in advance was provided as a substrate, with an electrode thickness of 70 nm and a glass thickness of 0.6 cm.
Spin-coating and drying were performed on the substrate to form a hole transport layer with a thickness of 30 nm and made of a poly(3,4-ethylenedioxythiophene)-poly(styrene sulfonate) material.
Spin-coating and drying were performed to form a perovskite layer with a thickness of 40 nm and made of a formamidine lead bromide perovskite material or a methylamine lead bromide perovskite material.
Amino polar solvents n-pentylamine and ethyl acetate were mixed to prepare a universal treatment solution, a volume fraction of the amino polar solvents was 1%, then 300 μL of treatment solution was drip-coated onto the perovskite layer to be maintained for 2 s at room temperature (about 25° C.), and then the treatment solution was annealed for 10 s at 140° C., to form the treated perovskite layer.

Evaporation was performed on the perovskite layer to form an electron transport layer with a thickness of 30 nm and made of a 1,3,5-tri(1-phenyl-1H-benzimidazol-2-yl) benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures. Meanwhile, the photovoltaic conversion performance and operational lifetime of the prepared perovskite device are significantly improved compared with those before treatment.

Example 10

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a formamidine lead bromide perovskite material or a methylamine lead bromide perovskite material.

Amino polar solvents n-octylamine and n-hexane were mixed to prepare a universal treatment solution, and a volume fraction of the amino polar solvent was 1.5%;

then 300 μL of treatment solution was drip-coated onto the perovskite layer to be maintained for 10 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures. Meanwhile, the photovoltaic conversion performance and operational lifetime of the prepared perovskite device are significantly improved compared with those before treatment.

Example 11

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a formamidine lead bromide perovskite material or a methylamine lead bromide perovskite material.

Amino polar solvents pentanesulfonic acid and n-octane were mixed to prepare a universal treatment solution, and a volume fraction of the amino polar solvent was 1.5%;

then 300 μL of treatment solution was drip-coated onto the perovskite layer to be maintained for 10 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures. Meanwhile, the photovoltaic conversion performance and operational lifetime of the prepared perovskite device are significantly improved compared with those before treatment.

Example 12

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a formamidine lead bromide perovskite material or a methylamine lead bromide perovskite material.

Amino polar solvents hexanesulfonic acid and chloroform were mixed to prepare a universal treatment solution, and a volume fraction of the amino polar solvent was 1.5%;

then 300 μL of treatment solution was drip-coated onto the perovskite layer to be maintained for 10 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 13

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a methylamine lead bromide perovskite material or a formamidine lead bromide perovskite material.

Amino polar solvents heptanesulfonic acid and carbon tetrachloride were mixed to prepare a universal treatment solution, and a volume fraction of the amino polar solvent was 1.5%;

then 300 μL of treatment solution was drip-coated onto the perovskite layer to be maintained for 10 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 14

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a methylamine lead bromide perovskite material.

Amino polar solvents heptanesulfonic acid and carbon tetrachloride were mixed to prepare a universal treatment solution, and a volume fraction of the amino polar solvent was 1.5%;

then 300 μL of treatment solution was drip-coated onto the perovskite layer to be maintained for 3 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 15

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a cesium lead iodine perovskite material.

Amino polar solvents heptanesulfonic acid and carbon tetrachloride were mixed to prepare a universal treatment solution, and a volume fraction of the amino polar solvent was 1.5%;

then 300 μL of treatment solution was drip-coated onto the perovskite layer to be maintained for 4 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 16

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a cesium lead iodine perovskite material.

Amino polar solvents heptanesulfonic acid and carbon tetrachloride were mixed to prepare a universal treatment solution, and a volume fraction of the amino polar solvent was 1.5%;

then 300 µL of treatment solution was drip-coated onto the perovskite layer to be maintained for 7 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 17

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a cesium lead iodine perovskite material.

Amino polar solvents heptanesulfonic acid and carbon tetrachloride were mixed to prepare a universal treatment solution, and a volume fraction of the amino polar solvent was 1.5%;

then 300 µL of treatment solution was drip-coated onto the perovskite layer to be maintained for 5 s at room temperature (about 25° C.), and then the treatment solution was annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 18

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a formamidine lead bromide perovskite material or a methylamine lead bromide perovskite material.

Amino polar solvents heptanesulfonic acid and carbon tetrachloride were mixed to prepare a universal treatment solution, and a volume fraction of the amino polar solvent was 1.5%;

then 300 µL of treatment solution was drip-coated onto the perovskite layer to be maintained for 10 s at a slightly high temperature (about 45° C.) and then annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 19

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a formamidine lead bromide perovskite material or a methylamine lead bromide perovskite material.

Amino polar solvents heptanesulfonic acid and carbon tetrachloride were mixed to prepare a universal treatment solution, and a volume fraction of the amino polar solvent was 1.5%;

then 300 µL of treatment solution was drip-coated onto the perovskite layer to be maintained for 10 s at a slightly high temperature (about 50° C.) and then annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 20

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a formamidine lead bromide perovskite material or a methylamine lead bromide perovskite material.

Amino polar solvents heptanesulfonic acid and carbon tetrachloride were mixed to prepare a universal treatment solution, and a volume fraction of the amino polar solvent was 1.5%;

then 300 µL of treatment solution was drip-coated onto the perovskite layer to be maintained for 10 s at a slightly low temperature (about 15° C.) and then annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Example 21

This example provides a preparation process of a perovskite device, including a treatment process for a perovskite layer, which is specifically as follows:

A piece of glass with an indium tin oxide electrode prepared in advance was provided as a substrate, with an electrode thickness of 70 nm and a glass thickness of 0.6 cm.

Spin-coating and drying were performed on the substrate to form a hole transport layer with a thickness of 30 nm and made of a poly(3,4-ethylenedioxythiophene)-poly(styrene sulfonate) material.

Spin-coating and drying were performed to form a perovskite layer with a thickness of 40 nm and made of a formamidine lead bromide perovskite material or a methylamine lead bromide perovskite material.

Amino polar solvents heptanesulfonic acid and carbon tetrachloride were mixed to prepare a universal treatment solution, and a volume fraction of the amino polar solvent was 1.5%;

then 300 µL of treatment solution was drip-coated onto the perovskite layer to be maintained for 10 s at a slightly low temperature (about 5° C.) and then annealed for 600 s at 60° C., to form the treated perovskite layer.

Evaporation was performed on the perovskite layer to form an electron transport layer with a thickness of 30 nm and made of 1,3,5-tri (1-phenyl-1H-benzimidazol-2-yl)benzene material.

An electrode was formed to electrically connect the hole transport layer and the electron transport layer in respective, to finally form a perovskite light-emitting diode.

Through characterization test, it is found that the perovskite layer provided in this example gains the same improvement, at least including the improvement in aspects of surface roughness, defect density and nanosheet phase structures.

Meanwhile, the photovoltaic conversion performance and operational lifetime of the prepared perovskite device are significantly improved compared with those before treatment.

Based on the above embodiments and comparative examples, it can be clarified that, by utilizing the selective solubility of the perovskite material in polar and non-polar solvents, the universal treatment solution and treatment method provided by the present disclosure react with various defects or non-ideal phases formed in the preparation process of the perovskite, to remove defects and harmful non-ideal phases that cause the perovskite to degrade, thereby significantly improving the performance of the perovskite materials. Since its principle of action does not change as the type and composition of the perovskite material change, the universal treatment solution and treatment method have a significant effect on the current perovskite material of almost all components.

Meanwhile, since specific groups in the universal treatment solution and treatment method provided in embodiments of the present disclosure have extremely strong reactivity, the treatment time for the treatment method provided by the present disclosure is extremely short, thus having low requirements on the treatment temperature and equipment, which significantly improves the treatment efficiency of perovskite layers and reducing treatment costs, and is very conducive to promoting the applications in industry.

It should be understood that the above embodiments are only for illustrating the technical concept and characteristics of the present disclosure, and their purpose is to enable those skilled in the art to understand the content of the present disclosure and implement the preset disclosure accordingly, and cannot limit the scope of protection of the present disclosure. Any equivalent changes or modifications made based on the essence of the present disclosure shall be covered within the scope of protection of the present disclosure.

What is claimed is:

1. A universal treatment solution of a perovskite layer, comprising a polar solvent and a non-polar solvent, wherein the polar solvent comprises at least one selected from pentanesulfonic acid, hexanesulfonic acid, and heptanesulfonic acid, and a volume fraction of the polar solvent is 0.01-2%.

2. The universal treatment solution according to claim 1, wherein the volume fraction of the polar solvent in the universal treatment solution is 1-2%.

3. The universal treatment solution according to claim 1, wherein the volume fraction of the polar solvent is 0.5-1%.

4. The universal treatment solution according to claim 1, wherein the non-polar solvent comprises any one of or a combination of more than two of aromatics, esters, alkanes, and halogenated hydrocarbons.

5. The universal treatment solution according to claim 4, wherein the non-polar solvent comprises any one of or a combination of more than two of benzene, benzene derivatives, ethyl acetate, methyl acetate, n-hexane, n-octane, chloroform, and carbon tetrachloride.

6. A universal treatment method of a perovskite layer, comprising:

1) providing the perovskite layer;
  2) allowing the perovskite layer to be in contact with the universal treatment solution according to claim 1 for a modified treatment, time of the modified treatment being 2-10 s; and
  3) removing the universal treatment solution in the perovskite layer after the modified treatment.

7. The universal treatment method according to claim 6, wherein a temperature of the modified treatment is 0-50° C.

8. The universal treatment method according to claim 6, wherein the step 3) specifically comprises:

performing a drying treatment on the perovskite layer after the modified treatment;
  alternatively, performing an annealing treatment on the perovskite layer after the modified treatment.

9. The universal treatment method according to claim 8, wherein a temperature of the annealing treatment is 60-150° C., and time of the annealing treatment is 10-600 s.

10. A perovskite photoelectric device, comprising a first transport layer, a perovskite layer, and a second transport layer, wherein the perovskite layer is arranged between the first transport layer and the second transport layer, and the perovskite layer is subjected to the modified treatment through the universal treatment method according to claim 6.

11. A fabricating method of a perovskite photoelectric device, comprising:

a step of forming a first transport layer;
  a step of forming a perovskite layer on a surface of the first transport layer;
  a step of performing the modified treatment on the perovskite layer by using the universal treatment method according to claim 6; and
  a step of forming a second transport layer on a surface of the perovskite layer after the modified treatment.

12. The universal treatment method according to claim 6, wherein the volume fraction of the polar solvent in the universal treatment solution is 1-2%.

13. The universal treatment method according to claim 6, wherein in the universal treatment solution the volume fraction of the polar solvent is 0.5-1%.

14. The universal treatment method according to claim 6, wherein in the universal treatment solution, the non-polar solvent comprises any one of or a combination of more than two of aromatics, esters, alkanes, and halogenated hydrocarbons.

15. The universal treatment method according to claim 14, wherein in the universal treatment solution, the non-polar solvent comprises any one of or a combination of more than two of benzene, benzene derivatives, ethyl acetate, methyl acetate, n-hexane, n-octane, chloroform, and carbon tetrachloride.

* * * * *